United States Patent
Liu et al.

(10) Patent No.: US 6,218,284 B1
(45) Date of Patent: Apr. 17, 2001

(54) METHOD FOR FORMING AN INTER-METAL DIELECTRIC LAYER

(75) Inventors: Chih-Chien Liu, Taipei; Cheng-Yuan Tsai, Yunlin Hsien; Wen-Yi Hsieh, Hsinchu; Water Lur, Taipei, all of (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/241,841

(22) Filed: Feb. 1, 1999

(51) Int. Cl.$^7$ .................. H01L 21/76; H01L 21/4763; H01L 21/31
(52) U.S. Cl. .................. 438/624; 438/435; 438/437; 438/633; 438/680; 438/778; 438/783; 438/784
(58) Field of Search ................. 438/597, 404, 438/435, 437, 624, 631, 633, 637–640, 680, 778, 783, 784

(56) References Cited

U.S. PATENT DOCUMENTS 5,937,323 * 8/1999 Orczyk et al. ................. 438/624
6,008,120 * 12/1999 Lee ................................ 438/634

* cited by examiner

*Primary Examiner*—Richard Booth
*Assistant Examiner*—Ha Tran Nguyen

(57) ABSTRACT

A method for forming an inter-metal dielectric layer without voids therein is described. Wiring lines are formed on a provided substrate. Each of the wiring lines comprises a protective layer thereon. A liner layer is formed over the substrate and over the wiring lines. A fluorinated silicate glass (FSG) layer is formed on the liner layer by using high density plasma chemical vapor deposition (HDPCVD). A thickness of the FSG layer is about 0.9–1 times a thickness of the wiring lines. A cap layer is formed on the FSG layer using HDPCVD. A thickness of the cap layer is about 0.2–0.3 times a thickness of the wiring lines. An oxide layer is formed on the cap layer to achieve a predetermined thickness. A part of the dielectric layer is removed to obtain a planarized surface.

6 Claims, 2 Drawing Sheets

METHOD FOR FORMING AN INTER-METAL DIELECTRIC LAYER

BACKGROUND OF THE INVENTION

1. Field of the Invention

The invention relates in general to a method for fabricating a semiconductor structure, and more particularly to a method for forming an inter-metal dielectric layer.

2. Description of the Related Art

Inter-metal dielectric layers are generally used to separate and electrically isolate wiring lines and other conductors in semiconductor circuit devices. Such devices may include multiple layers of wiring lines and other conductors and require isolation between adjacent conducting structures and isolation between layers. As device are being scaled down to smaller geometries, the gaps between wiring lines generally have higher aspect ratios (ratio of height to width), which are harder to fill than small aspect ratio gaps. In addition, as the distance between wiring lines and other conductors becomes smaller, capacitive coupling between wiring lines and other conductors becomes a limitation on the speed of the integrated circuit device. For adequate device performance in reduced dimension devices, it is necessary for the dielectric provided between wiring lines to meet a number of requirements. The dielectric material should be able to completely fill the gap between conductors and should be planarizable so that successive layers can be deposited and processed. The dielectric material should also be resistant to moisture transport and have a low dielectric constant to minimize wiring capacitance between conductors and between layers.

It is extremely important to deposit a high quality, substantially void-free dielectric that can fill the small, high-aspect ratio gaps between wiring lines. Dielectric layers for wiring line isolation are often formed by chemical vapor deposition (CVD) processes which deposit material onto a surface by transporting certain gaseous precursors to the surface and causing the precursors to react at the surface. High density plasma chemical vapor deposition (HDPCVD) allows for the addition of a sputtering component to a plasma deposition process which can be controlled to promote gap-filling during deposition processes in a manner superior to conventional CVD processes. HDPCVD deposits a dielectric layer having superior density, moisture resistance and planarization properties as compared to conventional CVD dielectric layers. The bias sputtering component of HDPCVD derives from the introduction of an accelerating potential between the plasma-excited deposition gases and the deposition substrate. The ions accelerated by the bias sputtering component of HDPCVD processes etch the material present on the surface of the deposition substrate and sputter the etched material, generally to further recessed portions on the substrate. As an oxide is deposited onto the surface of a substrate by HDPCVD incorporating bias sputtering, the oxide is also etched from the surface of the substrate and sputtered into recessed portions of the substrate. As such, those portions of a deposited layer that are closest to a gap are the most likely to be etched and sputtered into the gap. This produces the well-known surface faceting of the HDPCVD process and the ability of the process to fill gaps effectively.

HDPCVD processes may accomplish both deposition and etching at the same time, depending on the level of a bias sputtering component chosen for the deposition environment during the process. Bias sputtering removes and redistributes dielectric material from wiring line sidewalls, enables substantially void-free filling of gaps and enhances planarization. As described above, the sputtering component acts to prevent material build-up at the corners of the wiring lines and results in better gap-filling.

In another aspect, as line width of a semiconductor device is reduced, the distance between two conductive layers is accordingly reduced, causing a more severe parasitic-capacitor effect. The dielectric constant (K) quantity of an inter-metal dielectric (IMD) layer between the conductive layers becomes an essential parameter. If the K quantity becomes high, the parasitic-capacitor effect becomes more severe. A large parasitic-capacitor effect may cause a large resistance-capacitance (RC) time delay (RC delay), resulting in a decrease of the operation speed of the device. Therefore, a faster operation speed can be achieved by reducing the K quantity of the IMD layer.

A conventional method provides a fluorinated silicon glass (FSG) film as an IMD layer over wiring lines using HDPCVD to decrease the dielectric constant of the IMD layer. The FSG film formed by HDPCVD is applied to fill a high aspect ratio gap. A silicon oxide layer is formed on the FSG film by plasma-enhanced CVD (PECVD) to provide a dielectric layer with a sufficient thickness. A chemical mechanical polishing (CMP) process is performed to remove a part of the silicon oxide layer. A planarized surface is thus obtained.

In order to fill high aspect ratio gaps between the wiring lines, an FSG film is deposited with a thickness that is about 1.2 times a thickness of the wiring lines. The thick FSG film is easily exposed while performing the CMP process. F atoms contained in the FSG film react with $H_2O$ in a slurry used in the CMP process and form hydrogen fluoride (HF). HF may erode metal used as a contact or an interconnect structure in subsequent steps.

However, the thickness of the FSG film is limited to avoid eroding metal. The thin FSG film cannot fully fill the gaps between the wiring lines. A thick PECVD silicon oxide layer is formed on the thin FSG film to achieve a predetermined thickness. But the PECVD silicon oxide layer results in worse gap-filling so that voids form in the small gaps between the wiring lines.

SUMMARY OF THE INVENTION

It is therefore an object of the invention to provide a method for forming an inter-metal dielectric layer without voids therein. Wiring lines are formed on a provided substrate. Each of the wiring lines comprises a protective layer thereon. A liner layer is formed over the substrate and over the wiring lines. A FSG layer is formed on the liner layer using HDPCVD. A thickness of the FSG layer is about 0.9–1 times a thickness of the wiring lines. A cap layer is formed on the FSG layer using HDPCVD. A thickness of the cap layer is about 0.2–0.3 times a thickness of the wiring lines. An oxide layer is formed on the cap layer to achieve a predetermined thickness. A part of the dielectric layer is removed to obtain a planarized surface.

The FSG layer and the cap layer are formed to fill the gaps between the wiring lines by HDPCVD to result in a good gap-filling ability. The liner layer is used to prevent the wiring lines from being attacked by the FSG layer. The cap layer is used to prevent exposure of the FSG layer while removing the oxide layer. Furthermore, the cap layer avoids voids formed from the bad gap-filling ability of the oxide layer.

BRIEF DESCRIPTION OF THE DRAWINGS

Other objects, features, and advantages of the invention will become apparent from the following detailed descrip

DESCRIPTION OF THE PREFERRED EMBODIMENT

An excessive etching component during HDPCVD dielectric deposition may damage wiring lines. Thus, the sputtering component is preferably controlled or other process characteristics are adjusted to protect the wiring lines and desired portions of the inter-metal dielectric. Favorable gap-filling with dielectric materials can be accomplished using HDPCVD as described below.

It should be appreciated that, while the present invention is described with reference to a particularly preferred embodiment, variations on the process having more stages or even providing continuous variation between different etching and sputtering conditions may be desirable. These more complicated implementations of the present invention are presently less preferred because of their greater complexity and increased process variability. The two layers (including a FSG layer and a cap layer) of the preferred gap fill structure perform particularly desirable functions in the invention's method. The liner layer deposited near the wiring lines (or other conductors) is formed in a HDPCVD process to provide a layer in a substantially conformal manner. The FSG layer and the cap layer are preferably provided over the liner layer with a sputtering component to provide high gap filling. The presently preferred embodiments utilize silicon glass for each layer within the gaps between the wiring lines, but it would be possible to utilize other materials if appropriate deposition techniques were available.

Figure 1:
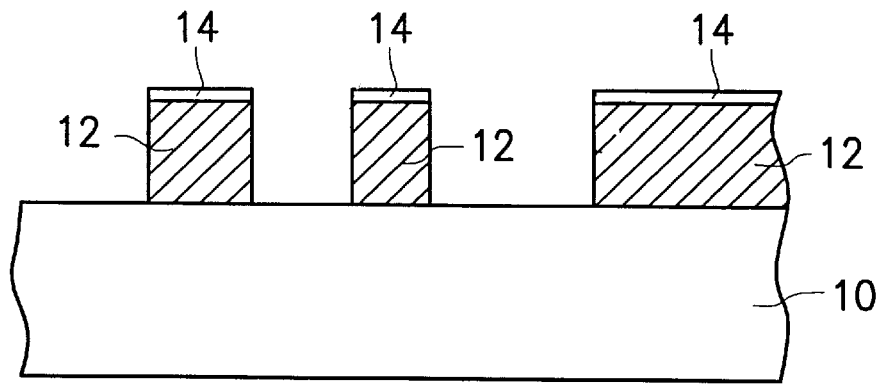
- FIGS. 1 to 5 illustrate the processing steps of one preferred embodiment of the method for forming an inter-metal dielectric layer.

A preferred embodiment of the present invention is now described with reference to FIGS. 1–5. FIG. 1 shows a schematic, cross-sectional view of a semiconductor substrate 10 having wiring lines 12 thereon. The wiring lines 12 may be formed from a variety of materials, such as aluminum, aluminum alloyed with silicon or copper, copper, alloys including copper and multi-layer structures including comparatively inexpensive metals and more expensive metals such as refractory metals. Between the wiring lines 12 lie gaps (not shown). The substrate 10 may contain a variety of elements, including, for example, transistors, diodes, and other semiconductor elements (not shown), as are well known in the art. The substrate 10 may also include other metal interconnect layers. A protective layer 14 is formed on the wiring lines 12.

Figure 2:
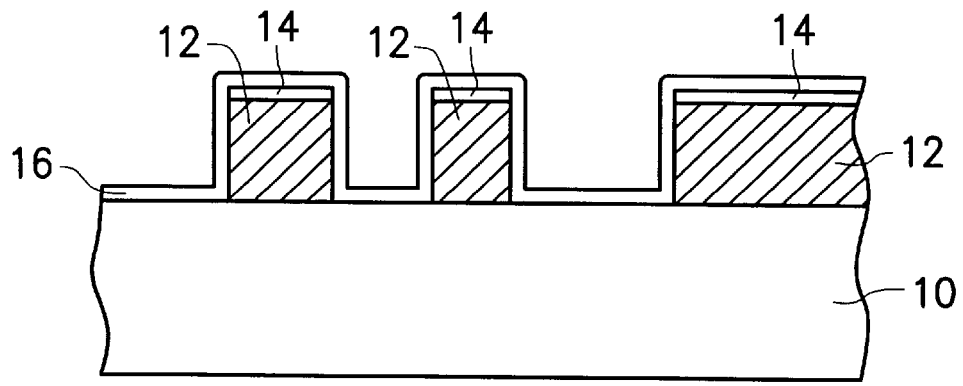

In FIG. 2, a conformal liner layer 16, such as an undoped silicon glass layer, is formed on the protective layer 14 and on the exposed substrate 10. The liner layer 16 is formed by, for example, HDPCVD and has a thickness of about 100–1000 Å. Because HDPCVD process includes etching and deposition at the same time, edges of the wiring lines are usually etched while performing the HDPCVD process. The protective layer 14 can prevent the wiring lines 12 from being etched.

Figure 3:
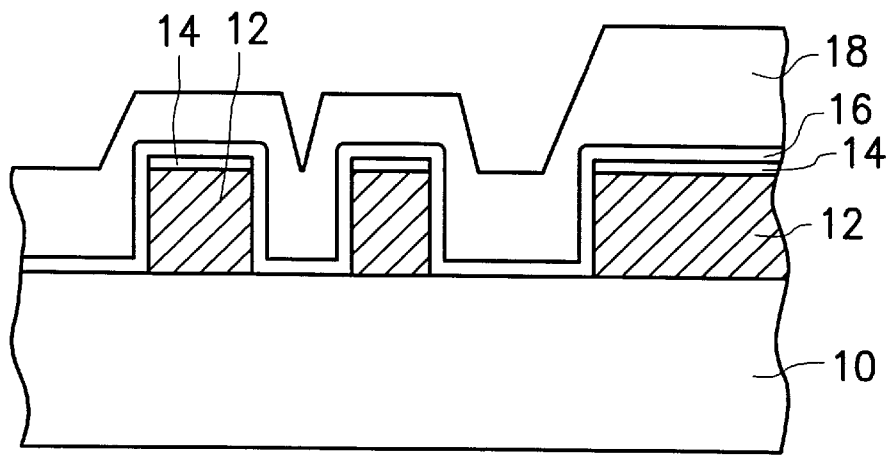

In FIG. 3, an FSG layer 18 is formed on the liner layer 16 by, for example, HDPCVD. A thickness of the FSG layer 18 is about 0.9–1.0 times a thickness of the wiring lines 12. The dielectric constant of the FSG layer is about 3.5 which is lower than other conventional dielectric materials so that the FSG layer can effectively decrease RC delay.

Figure 4:
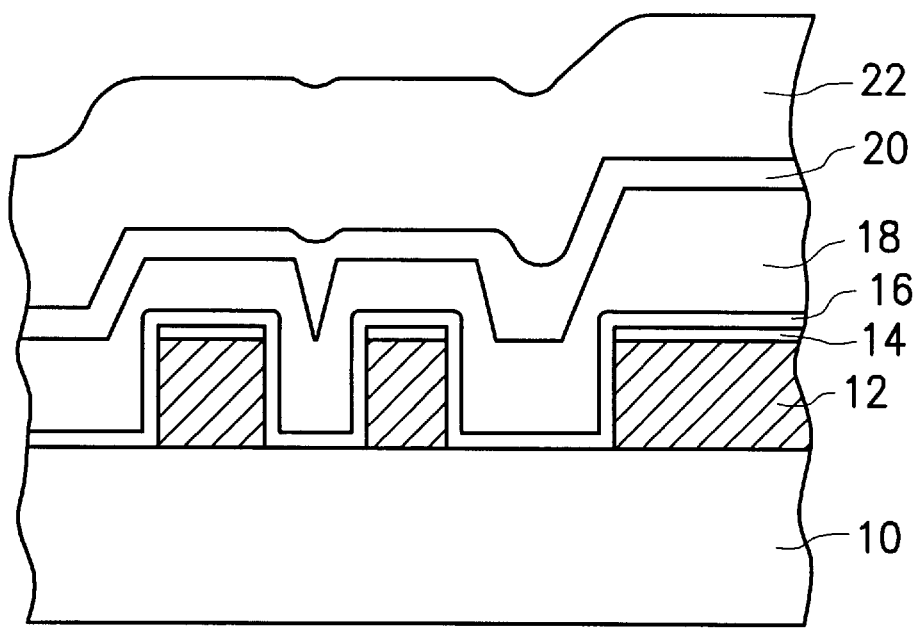

In FIG. 4, a cap layer 20, such as an undoped silicon glass layer, is formed on the FSG layer 18. The cap layer 20 is formed by, for example, HDPCVD and with a thickness that is about 0.2–0.3 times a thickness of the wiring lines 12. Since the cap layer 20 is formed by HDPCVD, the cap layer 20 can fill in the remaining gaps not filled by the FSG layer 18. Thus, no void is formed between the wiring lines 12.

Figure 5:
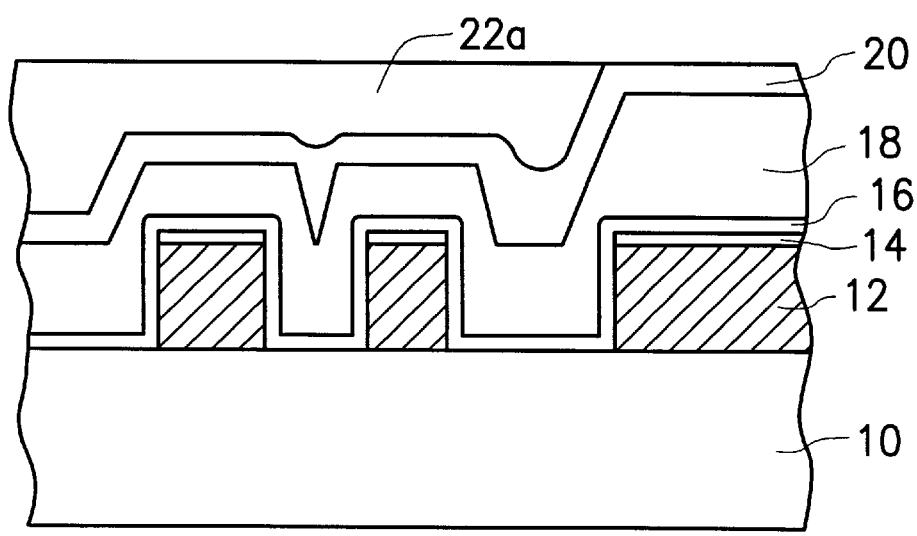

In FIG. 5, a dielectric layer 22, such as a silicon oxide layer is formed on the cap layer 20 by, for example, plasma-enhanced chemical vapor deposition (PECVD). The liner layer 16, the FSG layer 18, the cap layer 20 and the dielectric layer 22 constitute an inter-metal dielectric layer. Since the gaps are between the wiring lines 12, the top surface of the inter-metal dielectric layer is not planar. A CMP process is performed to planarize the inter-metal dielectric layer.

The cap layer can prevent the FSG layer from being exposed in the CMP process so that the F atoms don't react with $H_2O$ contained in slurry to form hydrogen fluoride (HF). Metal corrosion is thus avoided in subsequent steps. Furthermore, the cap layer is formed by HDPCVD so that the remaining gaps not filled by the FSG layer are filled without any voids therein.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming an inter-metal dielectric layer, comprising the steps of:

providing a substrate;

forming a plurality of wiring lines on the substrate;

forming a protective layer on the wiring lines;

forming a first undoped silicon glass layer over the wiring lines and over the substrate;

forming a fluorinated silicon glass layer on the first undoped silicon glass layer;

forming a second undoped silicon glass layer on the fluorinated silicon glass layer;

forming a oxide layer on the second undoped silicon glass layer; and polishing the oxide layer to obtain a planarized surface.

2. The method according to claim 1, wherein the first undoped silicon glass layer, the fluorinated silicon glass layer and the second undoped silicon glass layer are formed by high density plasma chemical vapor deposition.

3. The method according to claim 1, wherein a thickness of the first undoped silicon glass layer is about 100–1000 Å.

4. The method according to claim 1, wherein a thickness of the fluorinated silicon glass layer is about 0.9–1.0 times a thickness of the wiring lines.

5. The method according to claim 1, wherein a thickness of the second undoped silicon glass layer is about 0.2–0.3 times a thickness of the wiring lines.

6. The method according to claim 1, wherein the oxide layer is formed by plasma-enhanced chemical vapor deposition.

* * * * *